(12) United States Patent
Dea

(10) Patent No.: US 9,653,673 B1
(45) Date of Patent: May 16, 2017

(54) SYSTEM AND METHOD FOR CAPACITIVE HEAT TO ELECTRICAL ENERGY CONVERSION

(71) Applicant: The United States of America as represented by the Secretary of the Navy, Washington, DC (US)

(72) Inventor: Jack Y. Dea, San Diego, CA (US)

(73) Assignee: THE UNITED STATES OF AMERICA AS REPRESENTED BY THE SECRETARY OF THE NAVY, Washington, DC (US)

( * ) Notice: Subject to any disclaimer, the term of this patent is extended or adjusted under 35 U.S.C. 154(b) by 878 days.

(21) Appl. No.: 13/898,594

(22) Filed: May 21, 2013

Related U.S. Application Data

(63) Continuation-in-part of application No. 13/463,670, filed on May 3, 2012, now abandoned.

(51) Int. Cl.
*A01J 9/04* (2006.01)
*F01K 25/10* (2006.01)
(Continued)

(52) U.S. Cl.
CPC ........... *H01L 37/02* (2013.01); *A01J 9/04* (2013.01); *F01K 25/10* (2013.01); *F03B 7/003* (2013.01); *F03B 7/006* (2013.01); *F03B 17/00* (2013.01); *F03B 17/005* (2013.01); *F03B 17/02* (2013.01); *F03G 3/00* (2013.01); *F03G 6/00* (2013.01); *F03G 7/04* (2013.01); *G05D 23/2036* (2013.01);
(Continued)

(58) Field of Classification Search
CPC .. A01J 9/04; F01K 25/10; F03B 7/003; F03B 7/006; F03B 17/00; F03B 17/005; F03B 17/02; F03G 3/00; F03G 6/00; F03G 7/04; Y02E 10/10; Y02E 10/20; Y02E 10/34; Y02E 10/46; H01L 37/04; H01L 37/02; G05D 23/2036; Y02B 70/126; H03F 11/00
USPC ................ 60/639, 640, 641.1, 675; 219/491
See application file for complete search history.

(56) References Cited

U.S. PATENT DOCUMENTS 2,016,100 A    10/1935  Schwarzkopf
3,062,999 A *  11/1962  Brown ................... A61G 11/00
                                                    219/491
(Continued)

*Primary Examiner* — Mark Laurenzi
*Assistant Examiner* — Wesley Harris
(74) *Attorney, Agent, or Firm* — Kyle Eppele; Susanna J. Torke; Ryan J. Friedl

(57) ABSTRACT

A system includes at least one capacitor comprising a dielectric material having a Curie temperature, each capacitor exhibiting an increased capacitance at a temperature below the Curie temperature and exhibiting a decreased capacitance at a temperature above the Curie temperature, a liquid source positioned adjacent to the capacitor and having a temperature above the Curie temperature, and means for exposing the capacitor to the liquid source for a predetermined time so the temperature of the dielectric material exceeds the Curie temperature, at which point the capacitance decreases. A voltage storage is connected to the capacitors to capture the increased voltage discharged from the capacitors. The capacitors are then removed from the liquid source and cooled. The capacitors may iteratively be recharged, exposed to the liquid source until their temperature exceeds the Curie temperature, connected to the voltage storage, removed from the liquid source, and cooled.

18 Claims, 4 Drawing Sheets

(51) Int. Cl.
*F03B 7/00* (2006.01)
*F03B 17/00* (2006.01)
*F03B 17/02* (2006.01)
*F03G 3/00* (2006.01)
*F03G 6/00* (2006.01)
*F03G 7/04* (2006.01)
*H01L 37/04* (2006.01)
*H01L 37/02* (2006.01)
*G05D 23/20* (2006.01)
*H03F 11/00* (2006.01)

(52) U.S. Cl.
CPC .............. *H01L 37/04* (2013.01); *H03F 11/00* (2013.01); *Y02B 70/126* (2013.01); *Y02E 10/10* (2013.01); *Y02E 10/20* (2013.01); *Y02E 10/34* (2013.01); *Y02E 10/46* (2013.01)

(56) References Cited

U.S. PATENT DOCUMENTS

| | | | |
|---|---|---|---|
| 4,425,540 A * | 1/1984 | Olsen | ................ H01L 37/02 310/306 |
| 4,730,137 A | 3/1988 | Vollers | |
| 2006/0144048 A1 | 7/2006 | Schulz | |
| 2008/0122398 A1 | 5/2008 | Ho | |
| 2011/0048032 A1 | 3/2011 | Chang | |

\* cited by examiner

SYSTEM AND METHOD FOR CAPACITIVE HEAT TO ELECTRICAL ENERGY CONVERSION

CROSS-REFERENCE TO RELATED APPLICATIONS

This application is a continuation-in-part of U.S. patent application Ser. No. 13/463,670, filed on May 3, 2012, entitled "Low Temperature Magnetic Heat Engine," the entire content of which is fully incorporated by reference herein.

FEDERALLY-SPONSORED RESEARCH AND DEVELOPMENT

The System and Method for Capacitive Heat to Electrical Energy Conversion is assigned to the United States Government and is available for licensing for commercial purposes. Licensing and technical inquiries may be directed to the Office of Research and Technical Applications, Space and Naval Warfare Systems Center, Pacific, Code 72120, San Diego, Calif., 92152; voice (619) 553-5118; email ssc_pac_T2@navy.mil; reference Navy Case Number 101609.

BACKGROUND

Conversion of low temperature heat to electrical energy has been a long-standing challenge to engineers and scientists. A traditional approach involves use of a thermopile, which is inefficient and relatively expensive. A system and method for efficiently providing heat to electrical energy conversion is highly desirable.

DETAILED DESCRIPTION OF SOME EMBODIMENTS

The embodiments of the invention relate to a heat to electrical energy conversion system and method. The embodiments utilize a capacitor having dielectric with a specific Curie temperature. When charged capacitors are exposed to a liquid source having a temperature above the Curie temperature for a predetermined time such that the temperature of their dielectric material exceeds the Curie temperature, the capacitance decreases, causing an increase in the voltage output from the capacitor. The voltage output can then be stored in a voltage storage component. In one example application, a power plant, the energy lost in waste heat is as much as the electrical energy generated. Hence, using the system and method discussed herein to recover this waste heat can contribute greatly to the overall efficiency of the power plant.

Figure 1:
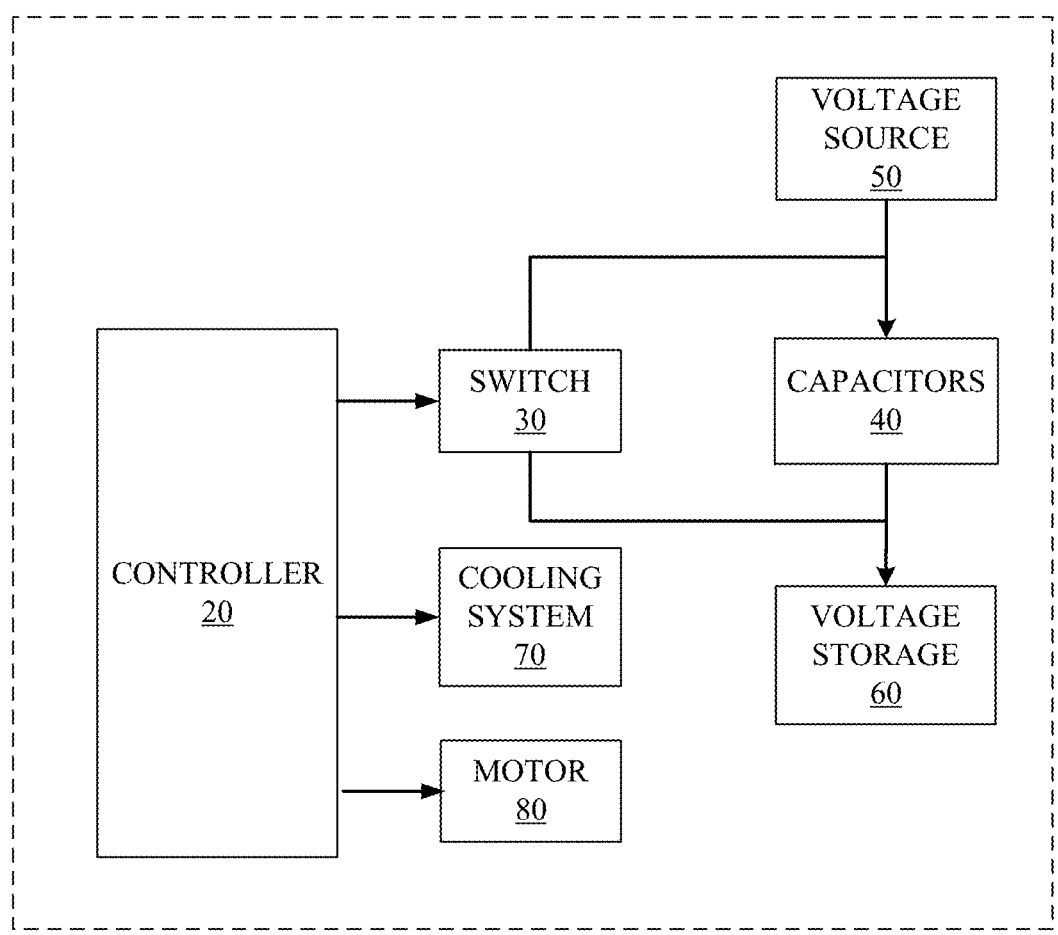
FIG. 1 shows a block diagram of an embodiment of a system in accordance with the System and Method for Capacitive Heat to Electrical Energy Conversion.

FIG. 1 shows a block diagram of an embodiment of a system 10 in accordance with the System and Method for Capacitive Heat to Electrical Energy Conversion. In some embodiments, system 10 may include a controller 20 connected to a switch 30, cooling system 70, and motor 80. Switch 30 may be connected between capacitors 40 and voltage source 50, as well as between capacitors 40 and voltage storage 60. Switch 30 may be a commercially available switch such Reed relays, power MOSFETS, or IGBT transistors.

Capacitors 40 each have a specific Curie temperature and are configured to exhibit an increased capacitance when their dielectric material is at a temperature below the Curie temperature and exhibit a decreased capacitance at a temperature above the Curie temperature. As used herein, the Curie temperature is the temperature above which the material loses its spontaneous electric polarization. Above the Curie temperature, a magnetic material loses its high permeability and a high permittivity material loses its high permittivity. A capacitor whose dielectric is made of a high permittivity ferro-electric material will have a high capacitance at a temperature below the Curie temperature, but will have a low capacitance when the temperature exceeds the Curie temperature. In a typical transition, the permittivity starts at 2000 below the Curie temperature and ends at 100 above the Curie temperature.

In some embodiments, capacitors 40 comprise a high permittivity ferro-electric dielectric material. As an example, capacitors 40 may comprise Barium Strontium Titanate (BST). BST is a multi-component single phase material with a Curie peak that can be moved by modifying the barium to strontium ratio. The permittivity of such material may be at least 300 and may range up to about 5000 depending upon the composition, manufacturing, and annealing process. Non-ferroelectric materials typically have permittivity less than 100. The Curie temperature of the BST material may be set by adjusting the ratio of barium to strontium during the manufacturing of the capacitor. For example, if energy is to be extracted from a liquid source at 50° C., then the Curie temperature is set at a few degrees below 50° C., say 47° C., and the appropriate ratio of barium to strontium is used in the dielectric material (see FIG. 5) such that capacitor 40 has a Curie temperature of 47° C.

In some embodiments, capacitors 40 each are configured to have dielectric materials with the same Curie temperature. In some embodiments, the dielectric material of capacitors 40 do not each have the same Curie temperature. Depending on the nature of the liquid source, the dielectric composition of capacitors 40 can be adjusted to suit the temperature of the liquid source. For example, if the temperature of discharge water from a cogeneration plant is 70° C., the Curie temperature for the dielectric may then be set a few degrees less than 70° C., such as 67° C., to insure that contact with the liquid source will set the dielectric material of the capacitor to a non-ferro-electric state.

Capacitors 40 may comprise any type of commercially available capacitor, with details depending upon the size, shape, and desired dielectric material Curie temperature. As an example, capacitors 40 may have specifications including a specific heat capacity of about 500 J/kg-K, a capacitance of about 200 µF/gram or 0.2 F/gram, and a change in temperature of about 10 K. From the data, a 1 kg capacitor pre-charged to 30 V and discharged at 90 V in 10 s generates 180 J electrical energy, while it absorbs 5000 J of heat energy, providing an efficiency of 3.6%. If the change in temperature can be reduced to 3 K, the efficiency would be around 10%. This is a higher efficiency than is generally obtained from typical thermopiles, which is typically less than 1%.

In operation, controller 20, which may be a commercially available controller specifically programmed to achieve the results discussed herein, may cause switch 30 to connect one or more capacitors 40 to voltage source 50 so that capacitors can be charged by voltage source 50. For example, each capacitor is pre-charged at a certain voltage, $V_o$. When each capacitor is in turn immersed in the liquid source, the new voltage would be $V=C_o/C*V_o$, where $C_o$ is the original capacitance, C is the capacitance after the dielectric material of the capacitor temperature exceeds the Curie temperature, and $V_o$ is the original voltage. Thus, if the capacitance decreased to ⅕ of original capacitance, then the new voltage would be 5 times the original voltage. The increased voltage can then be discharged to a voltage storage 60, which can be connected to capacitors 40 by switch 30. As an example, voltage storage 60 may comprise a battery or another capacitor.

Subsequent to charging, and as will be discussed further with respect to FIGS. 2 and 3, the charged capacitors will be exposed to a liquid source. The liquid source is positioned adjacent to the capacitor and has a temperature above the Curie temperature. If system 10 includes more than one capacitors, and the dielectric material of each of the capacitors do not have the same Curie temperature, then the temperature of the liquid source will be set at the highest Curie temperature capacitor. The liquid source may comprise any suitable liquid, such as water. The liquid source may be preheated, such as waste water from an electricity plant, or may be heated within a liquid container such as container 110 shown in FIG. 2, via a heating mechanism (not shown).

Figure 2:
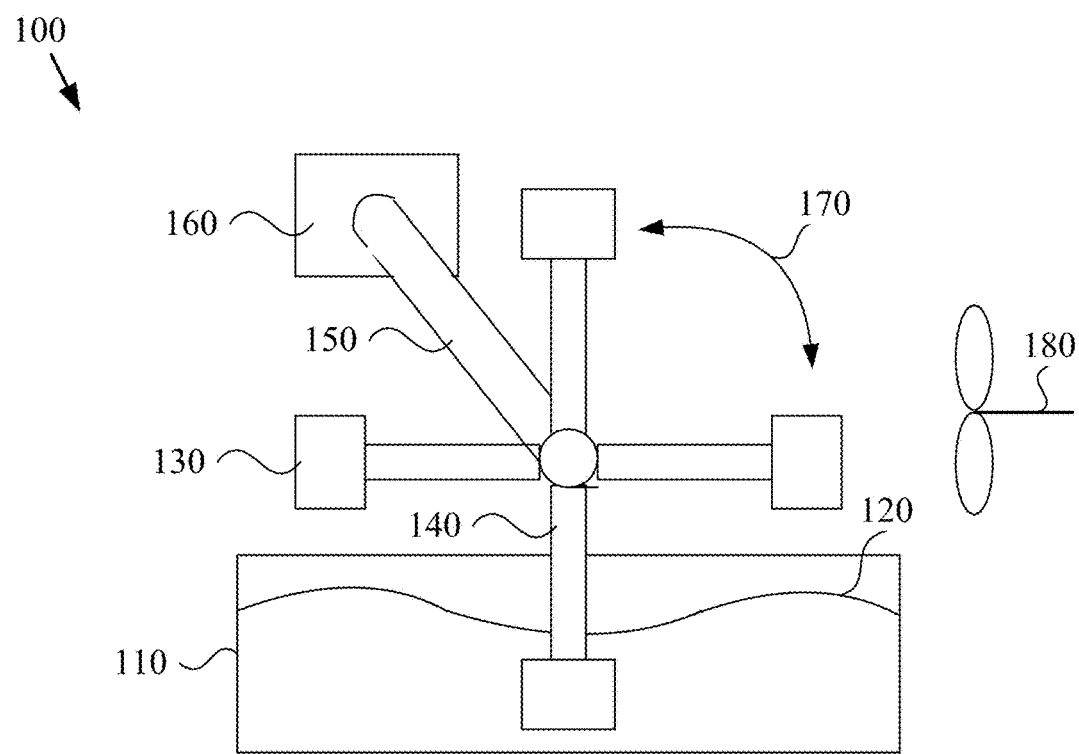
FIG. 2 shows a diagram of an embodiment of a system for sequential heating of capacitors in accordance with the System and Method for Capacitive Heat to Electrical Energy Conversion.

FIG. 2 shows a diagram of an embodiment of a system 100 for sequential heating of capacitors in accordance with the System and Method for Capacitive Heat to Electrical Energy Conversion. System 100 includes a liquid container 110 having a liquid source 120 therein, capacitors 130 each of which are each coupled to the end of a blade 140, which is connected to a shaft 150 driven by a motor 160. As shown by arrow 170, motor 160 causes shaft 150 to rotate and thus expose capacitors 130 to liquid source 120 or to remove capacitors 130 from liquid source 120. Blades 140 and shaft 150 may be comprised of any material, such as a lightweight and corrosion resistant material. For example, blades 140 and shaft 150 each comprise a polymer-based material.

System 100 may also include a cooling system, such as fan 180, to help cool capacitors 130 subsequent to their exposure to liquid source 120. A controller, such as controller 20 shown in FIG. 1, may cause motor 160 to rotate shaft 150 to cause capacitors 130 to be exposed to the liquid source 120. The controller may also cause cooling system 180 to turn on at the appropriate time to cool capacitors 130 such that the dielectric material temperature is below the Curie temperature after they have been removed from liquid source 120.

In some embodiments of system 100, the switching to cause the voltage source, such as voltage source 50, to connect to capacitors 130 to charge capacitors 130 as well as to connect capacitors 130 to the voltage storage, such as voltage storage 60, is performed by a controller connected to the switch, such as controller 20 connected to switch 30 as shown in FIG. 1. In some embodiments, the voltage source, switch, controller, and voltage storage can be located off of the rotating components of system 100, with appropriate wiring leading to and from the respective components, with the wiring to and from the capacitors being housed within blades 140 and shaft 150 for protection purposes. In some embodiments, the voltage source, switch, and controller can be located on the same platform as capacitors 130 on the edge of blade 140. In such embodiments, the components will be contained within a suitable waterproof housing. The voltage storage can be located off of blade 140 with suitable wiring extending thereto through blade 140 and shaft 150.

Figure 4:
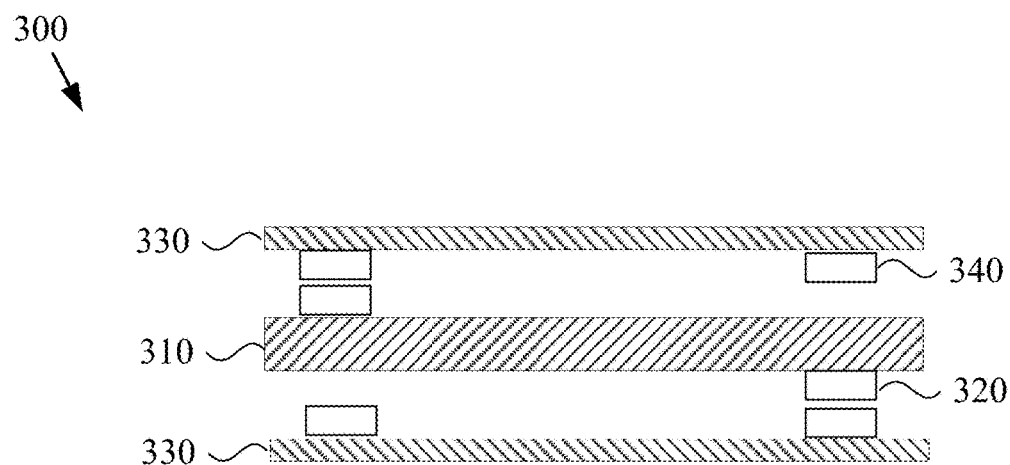
FIG. 4 shows a cross-section view of a shaft with internal switches in accordance with the System and Method for Capacitive Heat to Electrical Energy Conversion.

Other embodiments of system 100 may utilize mechanical switching. For example, FIG. 4 shows a cross-section diagram of system 300 that may replace shaft 150. System 300 includes a shaft 310 having one or more contacts 320 thereon. Shaft 310 is contained within a housing 330, which has one or more contacts 340 thereon. As shaft 310 rotates within housing 330, one or more of contacts 320 come into contact with one or more of contacts 340, providing a switching capability. Depending upon the location of the contacts 320 and 340 and the direction of rotation of shaft 310, the capacitors can be configured to be connected to the voltage source or the voltage storage at the appropriate time in relation to entering/exiting the liquid source. Wiring for the various components such as the voltage source, the switches, and voltage storage may be contained within housing 330.

Figure 3:
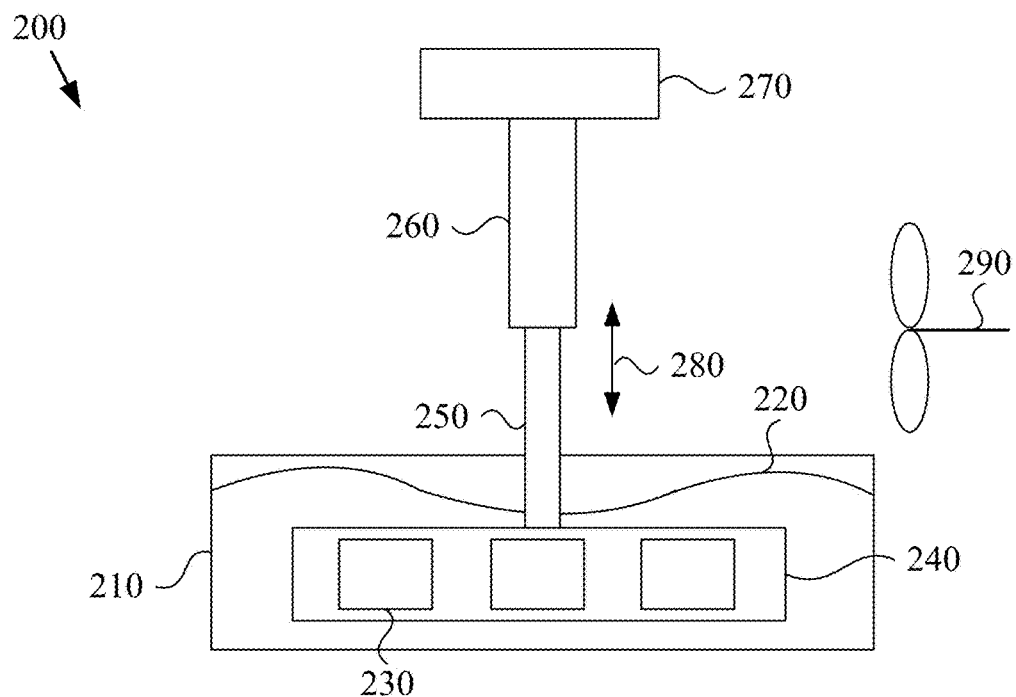
FIG. 3 shows a diagram of an embodiment of a system for simultaneous heating of capacitors in accordance with the System and Method for Capacitive Heat to Electrical Energy Conversion.

Referring to FIG. 3, FIG. 3 shows a diagram of an embodiment of a system 200 for simultaneous heating of capacitors in accordance with the System and Method for Capacitive Heat to Electrical Energy Conversion. System 200 includes a liquid container 210 having a liquid source 220 therein, capacitors 230 which are each coupled to a support 240, which is connected to a rod 250 that extends from or retracts into a housing 260 and is driven by a reciprocating motor 270 or actuator. As shown by arrow 280, motor 270 causes rod 250 to move down to expose capacitors 230 to liquid source 120 or to move up and remove capacitors 230 from liquid source 220. System 200 may also include a cooling system such as fan 290 to help cool capacitors 230 subsequent to their exposure to liquid source 220. A controller, such as controller 20 shown in FIG. 1, may cause motor 270 to move rod 250 to cause capacitors 230 to be exposed to the liquid source 220. The controller may also cause cooling system 290 to turn on at the appropriate time to cool the dielectric material of capacitors 230 to a temperature below the Curie temperature after they have been removed from liquid source 220.

Figure 5:
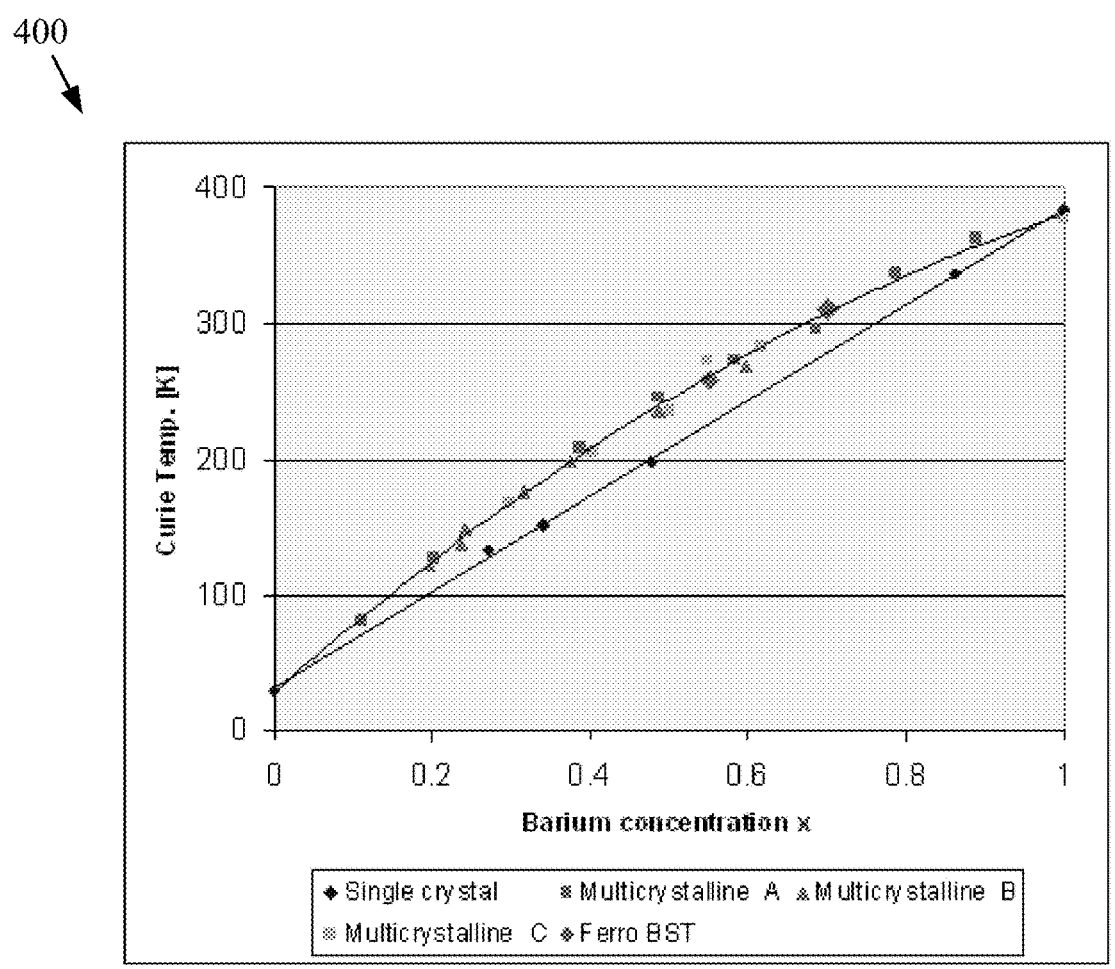
FIG. 5 shows a graph of the Curie temperature versus concentrations of Barium Strontium Titanate for various types of crystalline material that may be used in capacitors in accordance with the System and Method for Capacitive Heat to Electrical Energy Conversion.

FIG. 5 shows a graph 400 of the Curie temperature versus concentrations of barium for various types of crystalline material that may be used in capacitors in accordance with the System and Method for Capacitive Heat to Electrical Energy Conversion. A graph such as graph 400 may be used to help determine the appropriate ratio of materials to use in a dielectric material to achieve a specific Curie temperature. Using an example of a BST dielectric material for a capacitor, and desiring the temperature of the liquid source to be 342 K (50° C.), the Curie temperature of the capacitor could be set to be slightly less at 339 K. Using graph 400, 339 K corresponds to 0.82 for barium concentration. The strontium concentration is then 1−0.82=0.18. A factory could then make a capacitor, such as a large area flat capacitor, using the chemical formula $Ba_{0.82}Sr_{0.18}TiO_3$.

Figure 6:
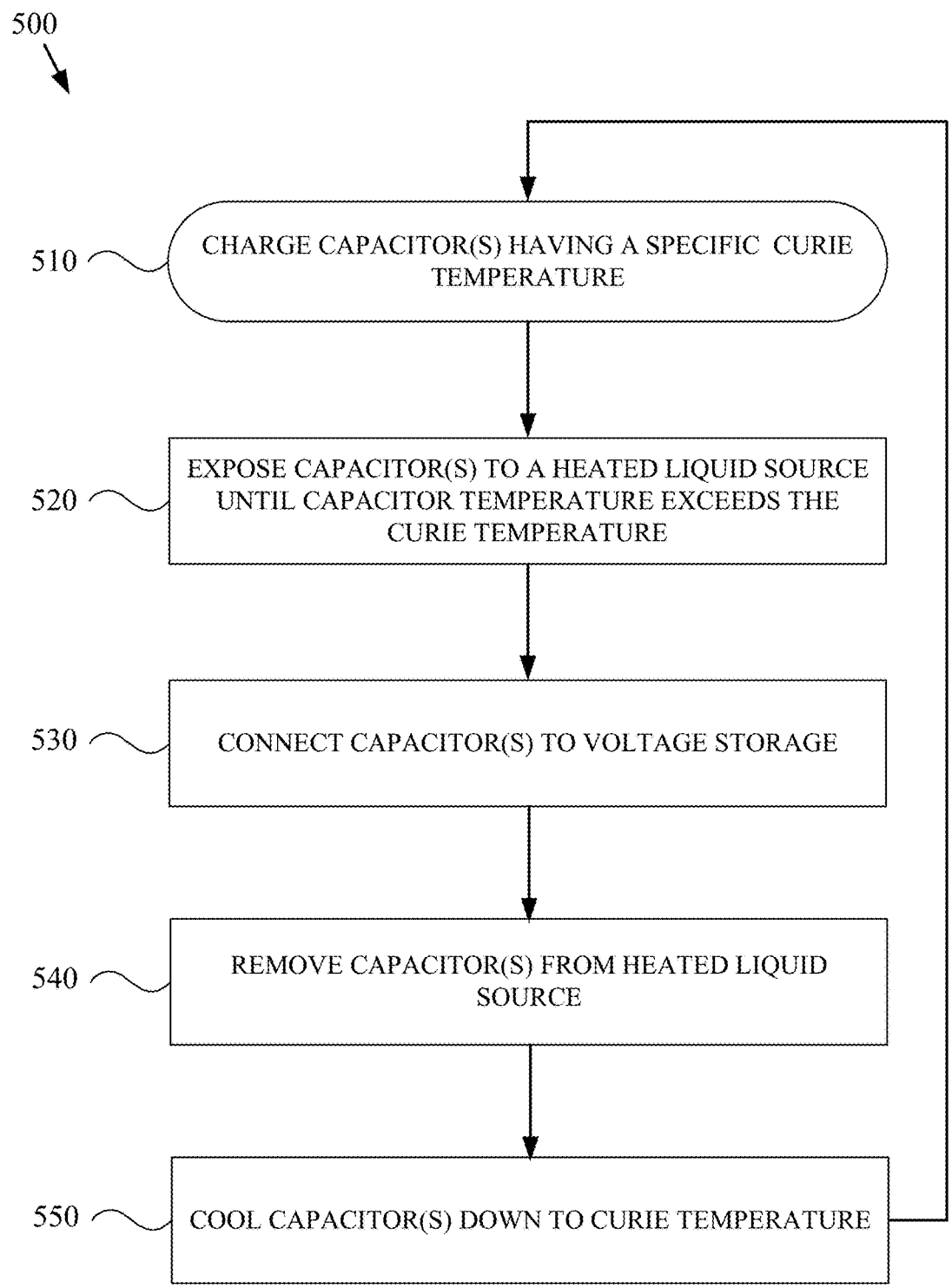
FIG. 6 shows a flowchart of an embodiment of a method in accordance with the System and Method for Capacitive Heat to Electrical Energy Conversion.

FIG. 6 shows a flowchart of an embodiment of a method 500 in accordance with the System and Method for Capacitive Heat to Electrical Energy Conversion. Method 500 may be performed using systems 10, 100, 200, and 300 as described herein, and will be described with reference to one or more of such systems and their respective components. Further, while FIG. 6 shows one embodiment of method 500 to include steps 510-550, other embodiments of method 500 may contain fewer steps. Further, while in some embodiments the steps of method 500 may be performed as shown in FIG. 6, in other embodiments the steps may be performed in a different order, or certain steps may occur simultaneously with one or more other steps.

Referring now to FIG. 6, method 500 may begin at step 510, which involves charging more than one capacitors, such as capacitors 40, 130, and 230. As an example, step 510 may be performed by controller 20 sending a signal to switch 30 to connect capacitors 40 to a voltage source 50, such as a battery. Step 520 involves exposing each capacitor to a liquid source for a predetermined time such that the temperature of the dielectric material of the respective capacitor exceeds the Curie temperature. For example, step 520 involves using motor 160 to rotate shaft 150 such that one of capacitors 130 is submersed in liquid source 120 for a specific time which depends upon the temperature of liquid source 120 and the composition of the dielectric material used for capacitor 130. As an example, if the capacitor comprises $Ba_{0.82}Sr_{0.18}TiO_3$, the temperature of the liquid source is 342 K, and the initial temperature of capacitor 130 is room temperature (about 293 K), capacitor 130 will need to be exposed to liquid source 120 for an estimated 10 seconds for a flat capacitor of 3 mm thickness and an area of 15 cm square. The immersion time is dependent on the geometry of the capacitor. Flat capacitors with large surface area require less time than thicker capacitors of equal weight.

Step 530 then involves connecting the capacitors to voltage storage. As an example, step 530 may be performed by controller 20 sending a signal to switch 30 to connect capacitors 40 to voltage storage 60, such as a battery or another capacitor. After the capacitance of the capacitor decreases due to the temperature of the dielectric material of the capacitor exceeding the Curie temperature, switch 30 may connect capacitors 40 to voltage storage 60 so that the capacitor will discharge a voltage, which will be greater than the initial voltage of the capacitor prior to being exposed to the liquid source, into voltage storage 60.

Step 540 involves removing the capacitors from the liquid source. As an example, controller 20 may send a signal to motor 160 to cause shaft 150 to rotate to cause capacitor 130 to be removed from liquid source 120. Step 550 may involve cooling the dielectric material of the capacitors down to a temperature at or below the Curie temperature. In some embodiments, step 550 may involve controller 20 sending a signal to power cooling system 70, such as fan 180, to cool capacitors 130. In some embodiments, the time delay between exposure of capacitors 130 to liquid source 120 allows for capacitors to cool without use of a cooling system. Following step 550, method 500 may continue back to step 510 and be repeated in an iterative process where the capacitors are charged, exposed to a liquid source, connected to a voltage storage, removed from the liquid source, and cooled.

Some or all of the steps of method 500 may be stored on a computer-readable storage medium, such as a non-transitory computer-readable storage medium, wherein the steps are represented by computer-readable programming code. Some or all of the steps of method 500 may also be computer-implemented using a programmable device, such as a computer-based system. Some or all of the steps of method 500 may comprise instructions that may be stored within a processor or programmable controller, such as controller 20 shown in FIG. 1, or may be loaded into a computer-based system, such that the processor or computer-based system then may execute some or all of the steps of method 500. Some or all of the steps of method 500 may be implemented using various programming languages, such as "Java", "C" or "C++".

Various storage media, such as magnetic computer disks, optical disks, and electronic memories, as well as non-transitory computer readable storage media and computer program products, can be prepared that can contain information that can direct a device, such as a micro-controller or processor, to implement some or all of the steps of method 500. Once an appropriate device has access to the information and programs contained on the storage media, the storage media can provide the information and programs to the device, enabling the device to perform the above-described systems and/or methods.

For example, if a computer disk containing appropriate materials, such as a source file, an object file, or an executable file, were provided to a computer, the computer could receive the information, appropriately configure itself and perform the functions of the various systems and methods outlined in the diagrams and flowcharts above to implement the various functions. That is, the computer could receive various portions of information from the disk relating to different elements of the above-described systems and/or methods, implement the individual systems and/or methods, and coordinate the functions of the individual systems and/or methods.

Many modifications and variations of the System and Method for Capacitive Heat to Electrical Energy Conversion are possible in light of the above description. Within the scope of the appended claims, the embodiments of the systems described herein may be practiced otherwise than as specifically described. The scope of the claims is not limited to the implementations and the embodiments disclosed herein, but extends to other implementations and embodiments as may be contemplated by those having ordinary skill in the art.

I claim:

1. A system comprising:
a motor;
a shaft connected to the motor, the shaft having a support mechanically coupled thereto;
a plurality of capacitors mechanically coupled to the support, the plurality of capacitors each comprising a dielectric material having a Curie temperature, wherein the Curie temperature is the same for each of the plurality of the capacitors, the plurality of capacitors each exhibiting an increased capacitance at a temperature below the Curie temperature and exhibiting a decreased capacitance at a temperature above the Curie temperature;

a liquid source positioned adjacent to the plurality of capacitors and having a liquid at a temperature above the Curie temperature;

a voltage source electrically connected to the plurality of capacitors;

a voltage storage electrically connected to the plurality of capacitors; and a controller connected to the motor, the controller configured to cause the motor to move the shaft to expose the plurality of capacitors to the liquid for a predetermined time such that the temperature of the dielectric material of the plurality of capacitors exceeds the Curie temperature, the controller further configured to operate the voltage source to charge the plurality of capacitors prior to the plurality of capacitors being exposed to the liquid.

2. The system of claim 1, wherein the plurality of capacitors each comprise a ferro-electric dielectric material having a relative permittivity of greater than about 300.

3. The system of claim 1, wherein the support comprises a plurality of blades, wherein a first end of each blade is mechanically connected to the shaft, wherein a second end of each blade is mechanically connected to one of the plurality of capacitors.

4. The system of claim 1, wherein the motor is configured to rotate the shaft to sequentially expose the plurality of capacitors to the liquid.

5. The system of claim 1, wherein the motor is configured to move the shaft down to expose each of the plurality of capacitors to the liquid simultaneously and to move the shaft up to remove the plurality of capacitors from the liquid simultaneously.

6. The system of claim 1, further comprising a switch operatively connected between the voltage source and the plurality of capacitors and between the voltage storage and the plurality of capacitors, the switch further operatively connected to the controller.

7. The system of claim 1, wherein the liquid is water.

8. The system of claim 1, further comprising a cooling source positioned adjacent to the plurality of capacitors and operatively connected to the controller, wherein the controller is configured to operate the cooling source to cool the plurality of capacitors subsequent to the exposure of the plurality of capacitors to the liquid.

9. A system comprising:
a motor;
a shaft connected to the motor and having a plurality of blades coupled thereto, wherein a first end of each blade is mechanically connected to the shaft;
a plurality of capacitors, wherein one of the plurality of capacitors is mechanically coupled to a second end of each of the blades such that each one of the plurality of capacitors is coupled to only one of the blades, each of the plurality of capacitors comprising a dielectric material having a Curie temperature, each of the plurality of capacitors exhibiting an increased capacitance at a temperature below the Curie temperature and exhibiting a decreased capacitance at a temperature above the Curie temperature;
a liquid source positioned adjacent to the plurality of capacitors and having a liquid at a temperature above a highest Curie temperature of the plurality of capacitors;
a voltage source electrically connected to the plurality of capacitors;
a voltage storage electrically connected to the plurality of capacitors; and
a controller connected to the motor, the controller configured to cause the motor to rotate the shaft to sequentially expose each one of the plurality of capacitors to the liquid for a predetermined time such that the temperature of the dielectric material of the plurality of the capacitors exposed to the liquid exceeds the Curie temperature, the controller further configured to operate the voltage source to charge the plurality of capacitors prior to the plurality of capacitors being exposed to the liquid.

10. The system of claim 9, further comprising a switch operatively connected between the voltage source and the plurality of capacitors and between the voltage storage and the plurality of capacitors, the switch further operatively connected to the controller.

11. The system of claim 9, further comprising a cooling source positioned adjacent to the plurality of capacitors and operatively connected to the controller, wherein the controller is configured to operate the cooling source to cool the plurality of capacitors subsequent to their exposure to the liquid.

12. The system of claim 9, wherein the plurality of capacitors comprise a ferro-electric dielectric material having a relative permittivity of greater than about 300.

13. The system of claim 12, wherein the ferro-electric dielectric material is barium strontium titanate.

14. A method for a controller that is part of a system comprising a motor, a shaft connected to the motor, the shaft having a support mechanically coupled thereto, a plurality of capacitors mechanically coupled to the support, a voltage source and a voltage storage each electrically connected to the plurality of capacitors, wherein the voltage source charges the plurality of capacitors and the plurality of capacitors are discharged into the voltage storage, and wherein the controller is connected to the motor, wherein the plurality of capacitors each comprise a dielectric material having a Curie temperature, each one of the plurality of the capacitors exhibiting an increased capacitance at a temperature below the Curie temperature and exhibiting a decreased capacitance at a temperature above the Curie temperature, the method comprising the steps of:
using the controller to cause the motor to move the shaft to expose each of the plurality of the capacitors to a liquid source having a temperature above a highest Curie temperature of the plurality of capacitors for a predetermined time such that the temperature of the dielectric material of the respective one of the plurality of capacitors exceeds the Curie temperature; and
using the controller to expose each of the plurality of capacitors to a cooling source, subsequent to exposing each of the plurality of capacitors to the liquid source, iteratively cooling each capacitor, and re-exposing each of the plurality of capacitors to the liquid source.

15. The method of claim 14, further comprising the step of cooling the dielectric material of each of the plurality of respective capacitors to a temperature below its respective Curie temperature subsequent to the exposure of the respective capacitor to the liquid source.

16. The method of claim 14, further comprising the step of charging each of the plurality of capacitors subsequent to the exposure of each of the plurality of capacitors to the cooling source and before re-exposing each of the plurality of capacitors to the liquid source.

17. The method of claim 14, wherein the step of using the controller to cause the motor to move the shaft to expose each of the plurality of capacitors to the liquid source comprises using the controller to cause the motor to rotate the shaft to expose the capacitors to the liquid source sequentially.

18. The method of claim 14, wherein the step of using the controller to cause the motor to move the shaft to expose each of the plurality of capacitors to the liquid source comprises using the controller to cause the motor to move the shaft down to expose each of the plurality of capacitors to the liquid source simultaneously and to move the shaft up to remove the plurality of capacitors from the liquid source simultaneously.

\* \* \* \* \*